United States Patent [19]

Moldovan

[11] Patent Number: 5,015,592
[45] Date of Patent: May 14, 1991

[54] METHOD OF FABRICATING A MULTI-LAYER METAL SILICIDE INFRARED DETECTOR

[75] Inventor: Anton G. Moldovan, Irvine, Calif.

[73] Assignee: Loral Aerospace Corp., New York, N.Y.

[21] Appl. No.: 504,195

[22] Filed: Apr. 3, 1990

Related U.S. Application Data

[62] Division of Ser. No. 390,800, Aug. 8, 1989.

[51] Int. Cl.$^5$ .............................................. H01L 31/18
[52] U.S. Cl. .......................................... 437/4; 437/3; 437/178; 437/201; 148/DIG. 80; 148/DIG. 147
[58] Field of Search ................ 437/3, 4, 178, 201; 148/DIG. 80, DIG. 19, DIG. 147

[56] References Cited

U.S. PATENT DOCUMENTS

| | | | |
|---|---|---|---|
| 4,244,750 | 1/1981 | Chenevas-Paule et al. | 357/30 |
| 4,492,971 | 1/1985 | Bean et al. | 437/175 |
| 4,496,964 | 1/1985 | Tsubouchi et al. | 357/30 |
| 4,524,374 | 6/1985 | Denda et al. | 357/15 |
| 4,544,939 | 10/1985 | Kosonocky et al. | 357/30 |
| 4,586,069 | 4/1986 | Königer et al. | 357/30 |
| 4,794,438 | 12/1988 | Levinson et al. | 357/29 |
| 4,908,686 | 3/1990 | Maserjian | 357/30 C |

OTHER PUBLICATIONS

J. C. Bean, and J. M. Poate, "Silicon/Metal Silicide Heterostructures Grown by Molecular Beam Epitaxy", Appl. Phys. Lett. 37, #7, pp. 643-646.

*Primary Examiner*—Brian E. Hearn
*Assistant Examiner*—Linda J. Fleck
*Attorney, Agent, or Firm*—Harry G. Weissenberger; Edward J. Radlo

[57] ABSTRACT

The efficiency of a metal silicide infrared detector (10) in greatly enhanced by depositing on the substrate (14) a stack (30) of alternating metal silicide (12,24) and silicon layers (22). The metal silicide layers (12,24) are connected to each other and to a contact pad (20) in the substrate (14) by a metal silicide deposit (32) on one side of the stack (30) and the silicon layers (22) are connected to each other and to the substrate (14) by a silicon deposit (34) on another side of the stack (30). The stacking of layers is made possible by depositing the silicon layers (22) at a rate of 1 Å/sec or less in a vacuum of $10^{-9}$ torr or better at a temperature of about 250° C.

7 Claims, 1 Drawing Sheet

METHOD OF FABRICATING A MULTI-LAYER METAL SILICIDE INFRARED DETECTOR

This is a divisional application of application Ser. No. 390,800, filed Aug. 8, 1989.

FIELD OF THE INVENTION

This invention relates to metal silicide cells for infrared imaging, and more particularly to a multi-layered cell construction which provides greatly improved sensitivity.

BACKGROUND OF THE INVENTION

Metal silicide photovoltaic cells are commonly used as photodetector elements in infrared (IR) imaging arrays. In particular, platinum silicide (PtSi) technology is well developed, and reliable PtSi focal plane arrays with uniform response can be manufactured with good yield and reproducibility. One drawback of PtSi arrays, however, is their low sensitivity. A typical PtSi layer will capture only 10% or less of the impinging photons per pass at a wavelength of 4 $\mu$m, for example. A reflective backing is commonly used on PtSi arrays to provide a double pass; however, the absorbency of a conventional cell is still less than 20%. In addition, because of the need for good resolution, individual cells of an IR detector array are severely constrained in size. Consequently, the output of individual cells is so low as to be seriously affected by electronic noise.

Prior art in the field includes U.S. Pat. No. 4,496,964 to Tsubouchi et al., which shows p-type polysilicon deposited on a PtSi layer to form a phototransistor; U.S. Pat. No. 4,524,374 to Denda et al. which concerns a single-layer PtSi phototransistor; U.S. Pat. No. 4,544,939 to Kosonocky et al. which deals with extending the wavelength response of a PtSi photodetector by interposing a high-impurity implant between the PtSi layer and the substrate; and U.S. Pat. No. 4,586,069 to Koniger et al which also concerns the interposition of a highly doped layer in a PtSi-silicon photodiode to provide improved sensitivity at specific wavelengths.

DISCLOSURE OF THE INVENTION

The present invention substantially increases the efficiency of PtSi photodetectors (10) by providing a stack (34) of alternating PtSi layers (12, 24) and silicon (22) which are electrically joined to form a single diode. If a detector (10) constructed according to the invention is further backed by a reflective surface (18), its absorbency becomes $$1-(1-c)^{2n}$$

where c is the fraction of the total impinging photons which is captured during a single transition through a PtSi layer (12, 24), and n is the number of layers (12, 24). For a five-layer structure, this translates into an absorbency of up to 65%.

In accordance with the invention, the silicon dioxide (SiO$_2$) layer (16) overlying a conventional PtSi diode (12, 14) is removed, and a silicon layer (22) of high quality is grown on the PtSi (12). Another PtSi layer (24) is then deposited on the silicon layer (22), and the process is repeated as many times as necessary.

When all the layers (22, 24) have been grown, a connecting layer of PtSi (34) is deposited on one side (28) of the stack (34) so as to contact the N$^+$ contact pad (20) conventionally formed in the silicon substrate (14) of the cell (10), and a connecting layer (30) of silicon is deposited on the other side (26) of the stack (34) so as to be in contact with the substrate (14). The covering SiO$_2$ insulating layer (16) is then restored, and a metallic reflector (18) may be deposited thereon in a conventional manner.

DESCRIPTION OF THE PREFERRED EMBODIMENT

Figure 1:
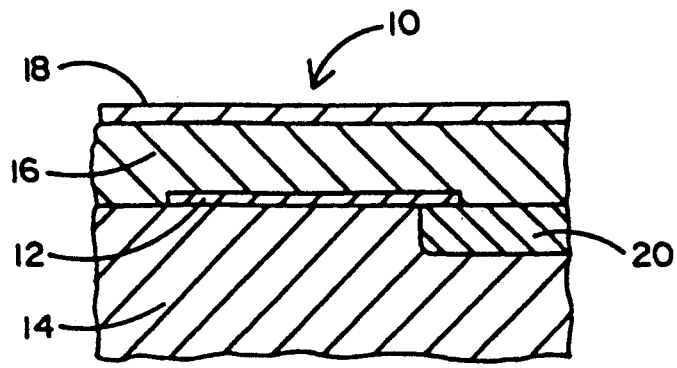
FIG. 1 is a fragmentary cross-section of a conventional PtSi array.

A conventional PtSi photodetector cell 10 (FIG. 1) consists of a thin (10–100 Å) PtSi layer 12 formed in a silicon substrate 14 which may be 0.5 mm thick. The substrate 14 and PtSi layer 12 are covered with a SiO$_2$ insulating layer 16 typically 5,000–8,000 Å thick, and a reflecting backing 18 which consists typically of a 1,000 Å thick aluminum film. An N$^+$ region 20 formed in the substrate 14 serves as a contact pad for the PtSi layer 12, allowing its connection to the array circuitry (not shown). The substrate 14 and SiO$_2$ insulation 16 are transparent to infrared radiation, with PtSi layer 12 being partly absorptive.

Conventional wisdom in the art has heretofore taught that PtSi or, in the alternative, palladium silicide (PdSi) or nickel silicide (NiSi) could only be deposited in a single layer because silicon films of sufficient quality could only be deposited over the PtSi layer at temperatures greatly exceeding the 450° C. heat tolerance of the PtSi or NiSi, or the 200°–300° C. tolerance of PdSi.

It has now been found that this problem can be overcome by slowly (1 Å/sec.) growing high-purity silicon over the metal silicide at substantially lower temperatures (as low as 250° C.) in an ultra-high vacuum (about 10$^{-9}$ torr or better), which is obtainable in a Molecular Beam Epitaxy (MBE) machine.

Consequently, in accordance with the preferred embodiment of the invention, a multi-layered PtSi photodetector cell is formed by first producing a conventional single-layer cell having a substrate 14 in which a PtSi layer 12 and a contact pad 20 are formed in the usual manner. Depending upon the manufacturing parameters involved, a SiO$_2$ layer 16 may or may not be deposited prior to continuing the fabrication of the cell in accordance with the invention. If the layer 16 is deposited at this point, it must then be etched away over the PtSi layer 12 and also over at least a portion of the contact pad 20 and the substrate 14 on each side of the PtSi layer 12.

Figure 2:
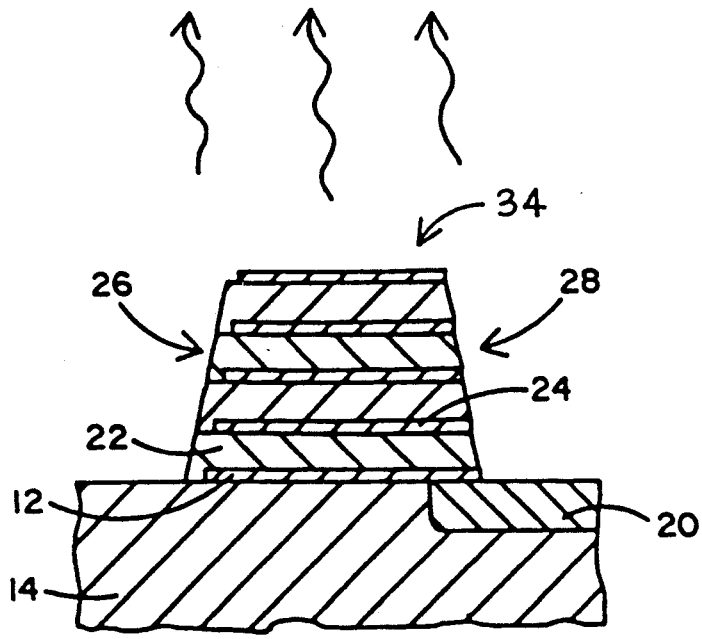
FIG. 2 is a sectional view illustrating the fabrication of the inventive cell.

As shown in FIG. 2, a silicon layer 22 of sufficient quality to avoid noise-producing thermal generation in the finished product and a good substrate for the next PtSi layer is next grown over the PtSi layer 12 and a portion of the substrate 14. The thickness of the layer 22 is dictated to some degree of the purity of the silicon but is not otherwise critical; however, it should at least be sufficiently thick (on the order of 100 Å) to prevent interaction between adjacent PtSi layers due to diffusion of the Pt during fabrication and ballistic carrier transport during device operation.

A second PtSi layer 24 is now formed on the layer 22 to the usual operative thickness of conventional PtSi photodetector technology over an area stopping short of one edge 26 of the layer 22 but coextensive with or overlapping the other edge 28 of layer 22.

Figure 3:
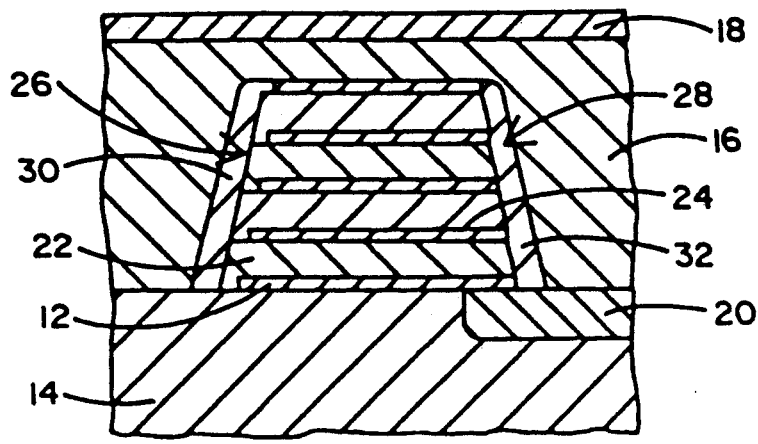
FIG. 3 is a sectional view showing the completed inventive cell.

The process used in depositing the layer 22 and 24 may be repeated as many times as desired to form the stack 34 shown in FIG. 3. When the stack 34 is completed, a connecting layer 32 of PtSi is deposited on the edge 28 so as to connect all the PtSi layers together and to the contact pad 20. Likewise, if necessary, an additional silicon connecting layer 30 may be deposited along the edge 26 to connect all the silicon layers to the substrate 14.

The inventive cell can now be completed by depositing the SiO$_2$ insulating layer 16 (or replacing removed portions thereof), and depositing the reflective backing 18. It will be understood that a similar process can be used with other applicable metal silicides.

What is claimed is:

1. A method of forming a multi-layered metal silicide infrared detector, comprising the steps of:
    (a) providing a silicon substrate having a single contact pad formed of N+ material therein;
    (b) depositing a metal silicide layer on said substrate in such a position as to place a portion of said metal silicide layer in contact with said contact pad;
    (c) depositing a stack including at least one set of alternating layers of silicon and the metal silicide over said metal silicide layer;
    (d) interconnecting said metal silicide layers to each other and to said contact pad with a connecting layer fabricated of the same metal silicide as in said metal silicide layers; and
    (e) interconnecting said silicon layers to each other and to said substrate with a connecting layer fabricated of silicon.

2. The method of claim 1, in which the interconnection of said metal silicide layers is done by depositing a connecting layer of metal silicide in such a manner as to be in contact with said metal silicide layers and said contact pad.

3. The method of claim 1, in which the interconnection of said silicon layers is done by depositing a connecting layer of silicon in such a manner as to be in contact with said silicon layers and said substrate.

4. The method of claim 1, in which said silicon layers are deposited at a rate of substantially 1 Å/sec or less in a vacuum of substantially $10^{-9}$ torr or better at a temperature of substantially 450° C. or less.

5. The method of claim 4, in which said silicon layers are deposited to a thickness of substantially 100 Å or more.

6. The method of claim 1, in which said metal silicide is platinum silicide.

7. The method of claim 1, further comprising the steps of:
    (f) forming a layer of insulation over said substrate, contact pad, and said stack, and
    (g) depositing a reflective metal layer over said insulating layer.

* * * * *